United States Patent [19]
Crisp et al.

[11] Patent Number: 5,636,745
[45] Date of Patent: Jun. 10, 1997

[54] TRAY FOR A COMPONENT AND AN APPARATUS FOR ACCURATELY PLACING A COMPONENT WITHIN THE TRAY

[75] Inventors: Rodney E. Crisp, Aptos; Terry W. Davis, San Jose; Stephen B. Van Ogle, Hayward, all of Calif.

[73] Assignee: Illinois Tool Works Inc., Glenview, Ill.

[21] Appl. No.: 330,029

[22] Filed: Oct. 27, 1994

[51] Int. Cl.⁶ .................................................. B65D 21/00
[52] U.S. Cl. .......................... 206/725; 206/509; 206/564
[58] Field of Search .................................. 206/722–726, 206/728, 499, 509, 511, 564

[56] References Cited

U.S. PATENT DOCUMENTS

| | | | |
|---|---|---|---|
| 2,944,722 | 7/1960 | Dahlhauser et al. | 206/509 |
| 3,549,018 | 12/1970 | Wilson | 206/509 |
| 3,623,634 | 11/1971 | Norgard | 206/509 |
| 3,907,111 | 9/1975 | Levenhagen | 206/564 |
| 3,946,864 | 3/1976 | Hutson | 206/725 |
| 4,379,505 | 4/1983 | Alemanni | 206/724 |
| 4,444,309 | 4/1984 | Morton, Jr. | 206/724 |
| 4,483,441 | 11/1984 | Akizawa et al. | 206/499 |
| 4,715,835 | 12/1987 | Matsuoka | 206/724 |
| 5,103,976 | 4/1992 | Murphy | 206/564 |
| 5,186,479 | 2/1993 | Flowers | 206/511 |
| 5,203,452 | 4/1993 | Small et al. | 206/725 |
| 5,400,904 | 3/1995 | Maston, III et al. | 206/509 |
| 5,413,224 | 5/1995 | Marron et al. | 206/511 |
| 5,450,959 | 9/1995 | Philippi | 206/564 |
| 5,492,223 | 2/1996 | Boardman et al. | 206/509 |

*Primary Examiner*—Paul T. Sewell
*Assistant Examiner*—Nhan T. Lam
*Attorney, Agent, or Firm*—Schwartz & Weinrieb

[57] ABSTRACT

A tray for housing integrated circuit components or chips and an apparatus for transporting the chips to the tray from a bulk supply of chips. The tray protects the chips against damage during handling, storage and shipping, can be readily and repeatedly connected to another like tray in a releasable manner, and is designed for positive alignment with respect to the apparatus. The apparatus is manually activated and readily transports the chips without damage.

20 Claims, 3 Drawing Sheets

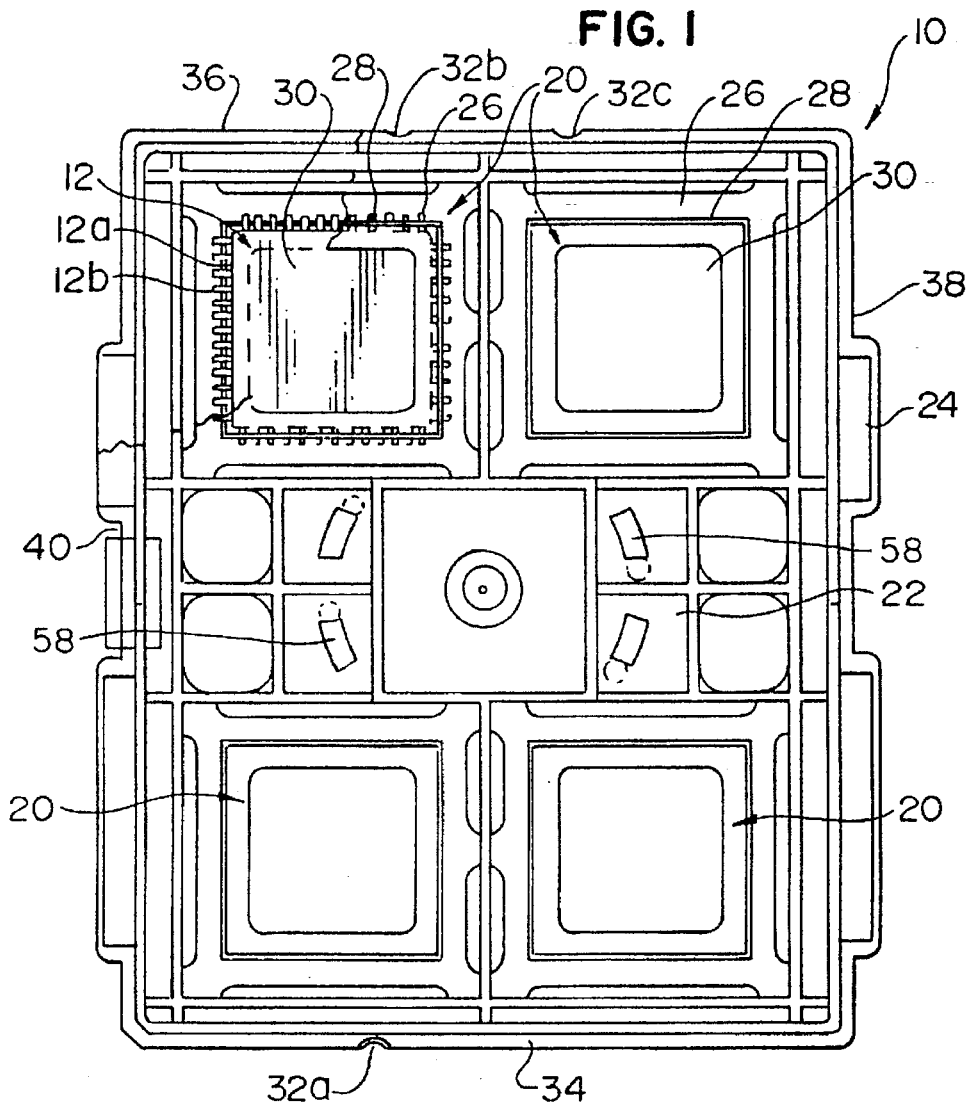
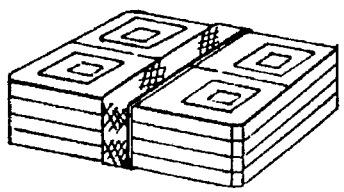
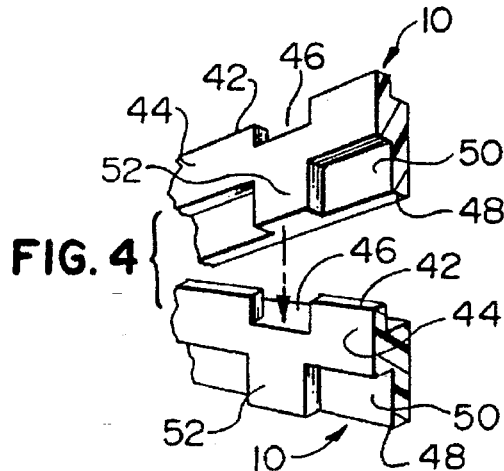
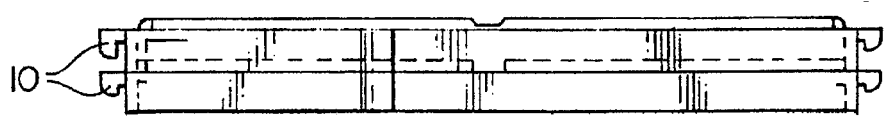

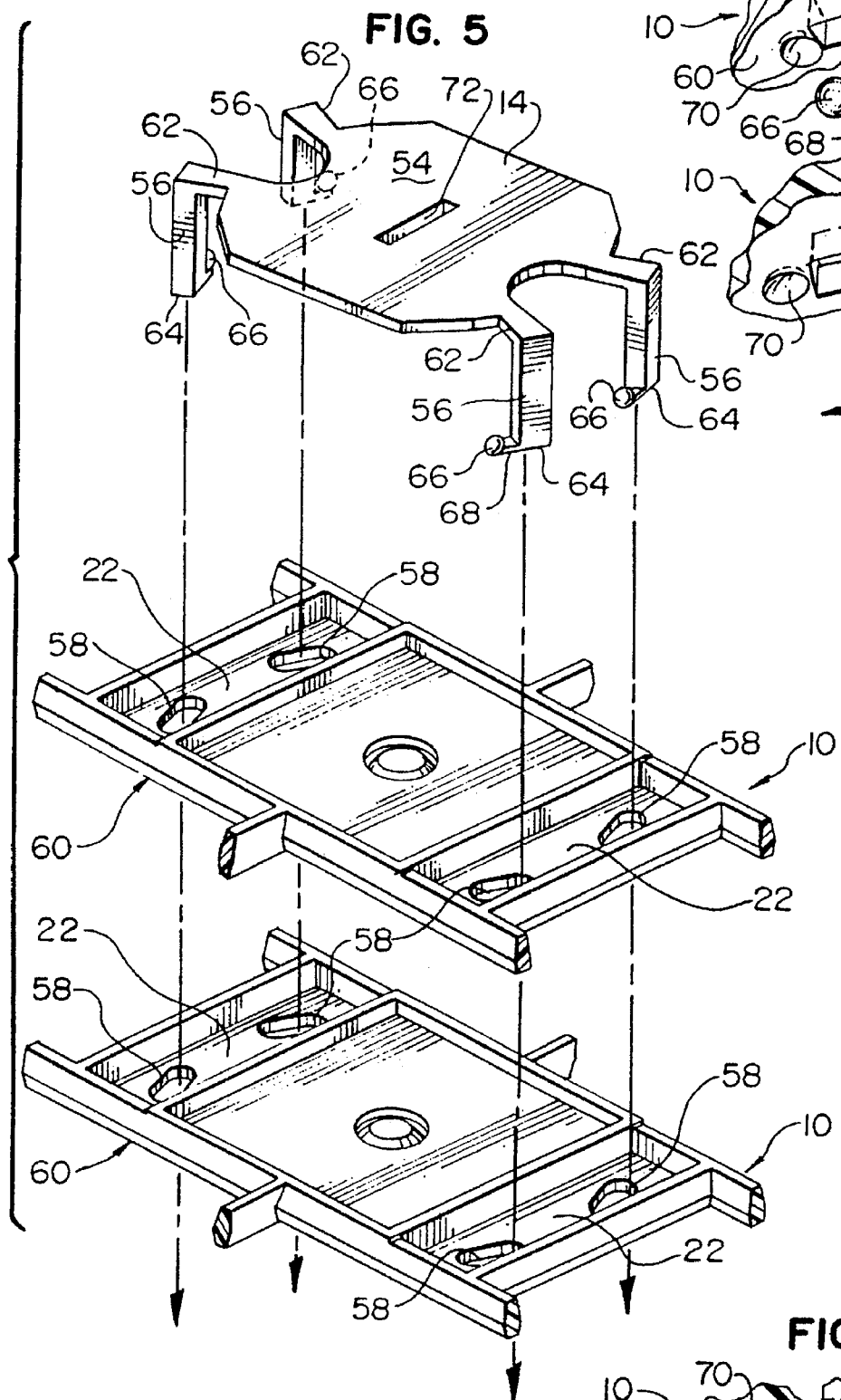
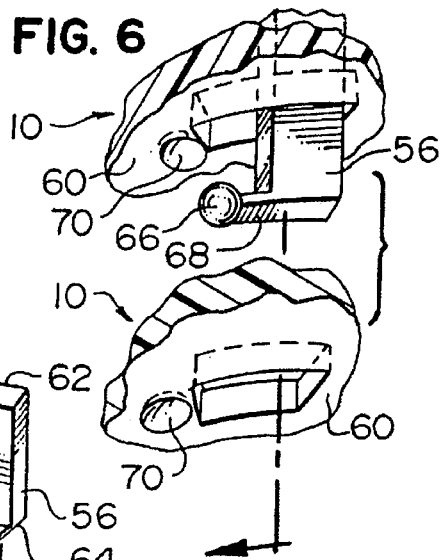
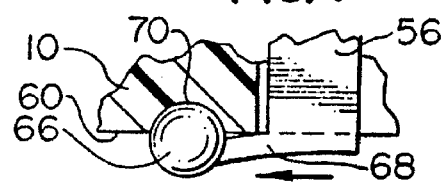

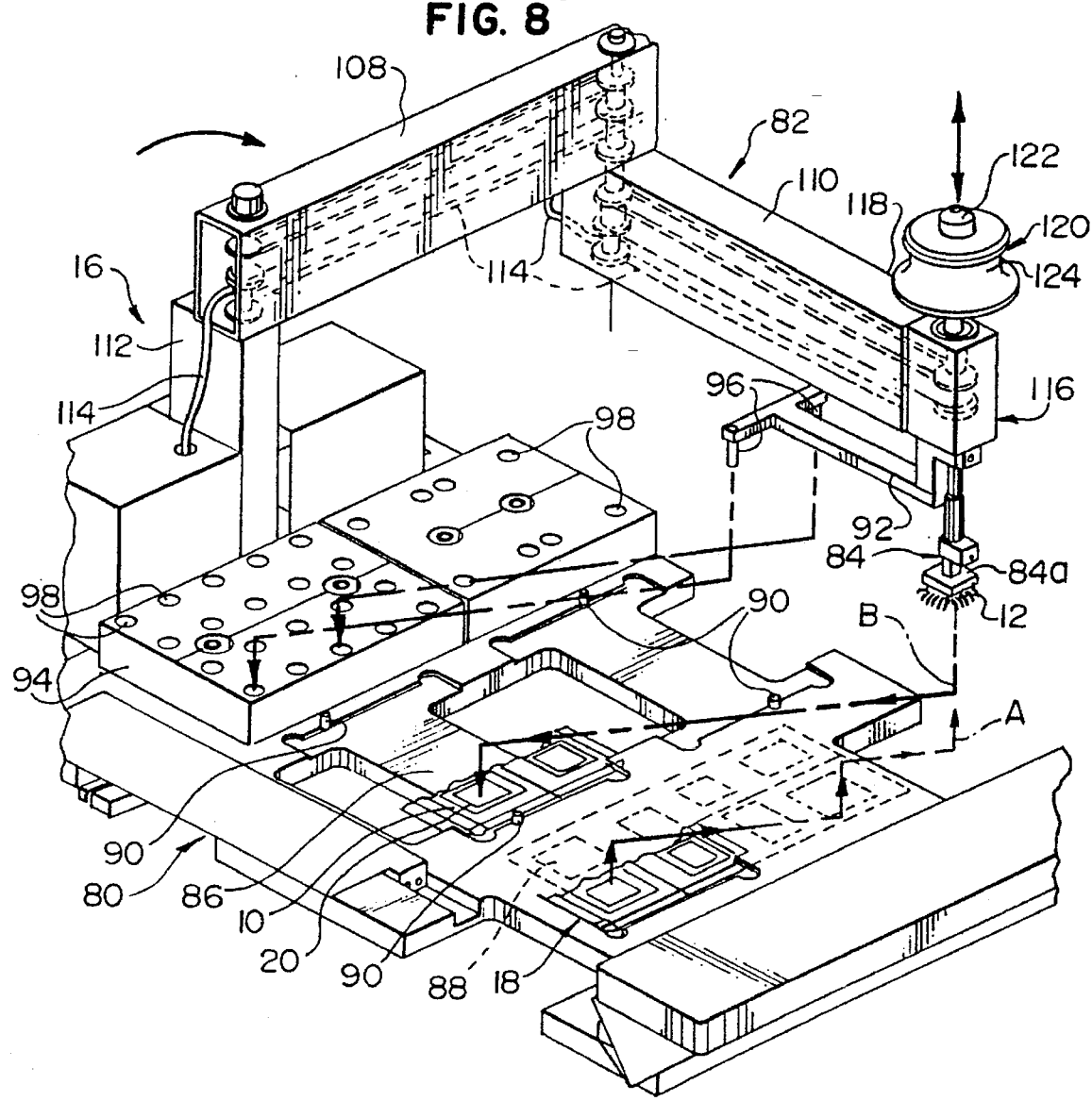
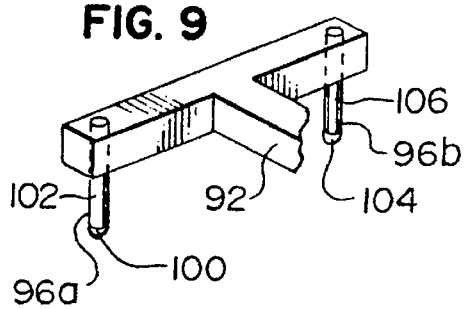
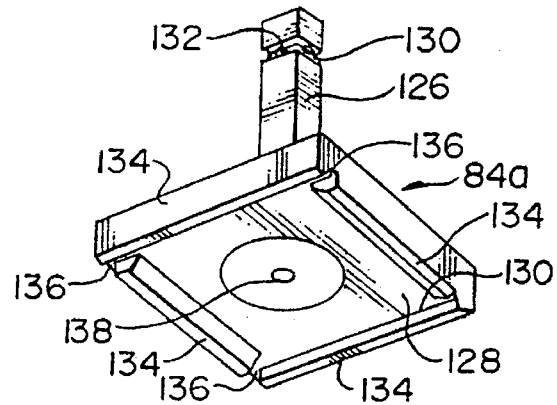

TRAY FOR A COMPONENT AND AN APPARATUS FOR ACCURATELY PLACING A COMPONENT WITHIN THE TRAY

FIELD OF THE INVENTION

The present invention relates generally to handling, packaging, storing and shipping integrated circuit components or chips and, more particularly, to a tray for housing one or more chips and protecting the chip against damage, and to an apparatus for accurately placing a chip within the tray without causing damage to the chip.

BACKGROUND OF THE INVENTION

Integrated circuit components or chips are typically made of semiconductor material and include a desired electrical circuit formed therein. The chips also typically include numerous electrical leads extending therefrom and are very fragile and sensitive to adverse handling.

Such chips are transported from the chip manufacturer in bulk to electronics manufacturers, chip distributors or the like. Distributors typically break a bulk of chips into smaller quantities for shipment to small manufacturers, resellers, repair facilities, individual users or the like.

In order to protect smaller quantities of chips against damage, a distributor typically places one or more chips in some type of tray or other container, and packages the tray and chip for shipping. If more than one tray is required, existing trays are typically arranged in a stack and are banded together with tape or some type of strap, as illustrated in FIG. 2, to prevent the stack from falling apart and causing damage to the chips.

Extreme care must be taken when transferring chips from the bulk containers to the smaller trays so as to eliminate damage which typically includes damage to the electrical leads from the chip. Automated pick-and-place systems can typically perform this task, but are extremely expensive and complicated and are not available to many chip distributors.

Trays for use with such automated pick-and-place systems rely on positioning of existing trays from a chamfered corner of the tray. Such corner positioning, however, is not precise due to the tolerances involved and can lead to mispositioning and damage to the chips.

It therefore would be desirable to provide a tray for integrated circuit components or chips which accepts one or more chips therein, protects the chip against damage during handling, storage and shipping and can be connected to a like tray by an engagement member formed from the same material as the tray. The invention also provides a cost effective apparatus for use by a distributor or the like to transfer chips from bulk containers to the trays without damaging the chips or associated electrical leads.

SUMMARY OF THE INVENTION

The invention provides for safe handling, packaging, storing and shipping of integrated circuit components or chips, particularly for smaller quantities of chips, which is typically useful for chip distributors. In one aspect of the invention, a tray is provided for housing one or more chips in a protective manner. In another aspect of the invention, an apparatus is provided for accurately and safely transferring chips from bulk storage containers or the like to the tray.

The tray of the invention is designed to be stackable with one or more other like trays and includes a locking member to secure the trays together. The locking member is readily activated by a user, preferably in a "twist-lock" manner and does not damage the chips in the tray. Preferably, two trays are secured where a bottom tray holds a desired number of chips and the top tray is empty and merely serves as a cover to retain and protect chips in the bottom tray.

The transfer apparatus of the invention is preferably a manually activated pick-and-place type mechanism that can readily be activated by a user to transport chips from a bulk tray or similar container to the tray of the invention. Upon holding of a chip by a vacuum head, an operator can readily position the chip for exact placement with respect to the tray which is precisely positioned on the apparatus for accurate placement.

BRIEF DESCRIPTION OF THE DRAWINGS

Numerous other features and advantages of the present invention will become readily apparent from the following description of the invention, the claims, and the accompanying drawings in which like reference characters designate like or corresponding parts throughout the several views, and wherein:

FIG. 1 is a top plan view of a tray of the present invention including an integrated circuit chip illustrated in partial section and positioned in one pocket portion thereof;

FIG. 2 is a perspective view of a plurality of prior art trays secured together with a strap;

FIG. 3 is a side elevational view of two trays of the present invention illustrating stacking of the trays;

FIG. 4 is an enlarged exploded perspective view illustrating the alignment structure of the trays of the present invention;

FIG. 5 is an exploded perspective view of a twist-lock engagement member of the invention along with portions of two trays of the invention illustrating securing of the trays by the engagement member;

FIG. 6 is an enlarged perspective view of a portion of the bottom of a tray of the invention illustrating details of the twist-lock engagement of the engagement member of the invention;

FIG. 7 is a enlarged fragmentary cross-sectional view of a portion of a tray and engagement member illustrating details of the engagement therebetween;

FIG. 8 is a perspective view of the pick-and-place apparatus of the invention;

FIG. 9 is an enlarged fragmentary perspective view of an alignment member of the apparatus of FIG. 8; and FIG. 10 is an enlarged bottom perspective view of the chip gripping head of the invention.

DESCRIPTION OF THE PREFERRED EMBODIMENTS

While this invention is susceptible of embodiment in many different forms, the specification and the accompanying drawings disclose one or more forms as examples of the invention. The invention is not intended to be limited to the embodiments described, the scope of the invention being pointed out in the appended claims.

For ease of description, the device and apparatus of this invention are described in typical operating positions and terms such as upper, lower, horizontal and the like are utilized with reference to these positions. It will be understood, however, that the device and apparatus of this invention may be manufactured, stored, transported and sold in an orientation other than the positions described.

Some of the figures illustrating the embodiments of the device and apparatus of the present invention show conventional components, structural details and mechanical elements that will be recognized by one skilled in the art. The detailed descriptions of such elements, however, are not necessary to an understanding of the invention and, accordingly, are not presented herein.

Referring to FIG. 1, a tray of the invention is generally designated by the reference numeral 10. The tray 10 is utilized to house one or more integrated circuit chips 12 so as to protect the chip 12 during handling, packaging, storing and shipping.

As FIG. 3 illustrates, the tray 10 can be stacked to provide a top cover to the bottom tray 10 or to increase the number of chips 12 in a particular shipment. To maintain at least two trays 10 in a stacked configuration, a twist-lock fastening or engagement member 14, illustrated in FIG. 5, is utilized.

As FIG. 8 illustrates, the tray 10 is preferably designed for use with a pick-and-place mechanism 16 that accurately assembles chips 12 to the tray 10 without damaging the chip 12. The mechanism 16 is preferably manually activated, is substantially portable and moves chips 12 from bulk containers 18 to the tray 10 as described in detail below.

Details of the tray 10 will first be provided followed by a detailed description of the structure and operation of the mechanism 16.

As FIG. 1 illustrates, the tray 10 is substantially rectangular in shape and is integrally formed from plastic or similar material. Preferably, the material of the tray 10 is heat resistant to enable processing of the chip 12 within the tray 10 if desired.

The tray 10 includes a predetermined number of pockets or sockets 20, one each for a respective chip 12. Although four pockets 20 are illustrated, the number of pockets 20 can vary as desired.

Each pocket 20 is configured to accept the particular shape of the chip 12 which in this embodiment is square. The particular shape of the pocket 20, however, can vary to accommodate the chip 12.

The pockets 20 are interconnected by a base portion 22 and an outer frame portion 24. The base portion 22 is configured to accept the twist-lock engagement member 14 while the outer frame portion 24 adds stability to the tray 10 as well as spacing and stacking of trays 10.

Each pocket 20 includes a base 26, an upstanding square or rectangular platform 28 and a central aperture 30 through the platform 28. The platform 28 supports a body 12a of the chip 12 while "gullwing" type leads 12b of the chip 12 can extend over the edge of the platform 28.

To precisely align the tray 10 with respect to the pick-and-place mechanism 16, each tray 10 includes one or more alignment or registration notches 32a–32c positioned on the exterior surface of the outer frame portion 24. The notch 32 provides a seat for a corresponding pin of the mechanism 16 to precisely position the tray 10 with respect to the mechanism 16 as explained in detail below.

In a preferred form of the invention, the tray 10 includes three notches 32a–32c. One notch 32a is positioned on a first minor side 34 of the tray 10 and two notches 32b and 32c are positioned on a second opposite minor side 36 of the tray 10. Two opposing major sides 38 and 40 of the tray 10 preferably do not include any notches.

For orientation of the tray 10 with respect to the mechanism 16, the notches 32b and 32c are positioned equidistant from a longitudinal axis of the tray 10 and the notch 32a is aligned with the notch 32b. Thus, the notches 32a–32c provide alignment with respect to the centerline of the tray 10, rather than the corners or edges thereof, which provides increased accuracy in positioning the tray 10 on the mechanism 16.

As FIGS. 3 and 4 illustrate, in order to stack two trays 10 one on top of the other, a top side 42 of each tray 10 includes an upstanding ridge 44 about its periphery having at least one cut-out 46. A bottom side 48 of each tray 10 includes a depending ridge 50 about its periphery having at least one protrusion 52 for seating within the cut-out 46.

Preferably, a cut-out 46 and corresponding protrusion 52 are provided along each side 34–40 proximate the middle thereof. It is to be understood, however, that the number, size, shape and position of the cut-out 46 and protrusion 52 can vary so long as they cooperate to provide the desired stacking.

In order to secure two trays 10 together in a stacked relationship, the twist-lock engagement member 14 can be utilized. As FIG. 5 illustrates, the engagement member 14 includes a base member 54 and preferably four integrally formed leg members 56 depending from opposite sides thereof. The leg members 56 extend through apertures 58 formed in the bases 22 of the trays 10 and are secured to a back side 60 of a tray 10 as described herein.

Each leg member 56 includes a first proximal end 62 connected to the base 54 and a second opposite distal end 64. Preferably, the length of each leg members 56 is selected for accommodating two trays 10, but the number of trays 10 accommodated by the leg members 56 can vary.

As FIGS. 5–7 illustrate, the distal ends 64 of the leg members 56 include a ball member 66 connected to the leg members 56 by a member 68 extending transverse to each leg member 56. The ball members 66 seat within corresponding sockets 70 formed in the back side 60 of the tray 10.

Accordingly, after insertion of the ball members 66 of each leg member 56 through the apertures 58, the engagement member 14 is twisted clockwise until each ball member 66 is seated within a respective socket 70. To assist in turning of the engagement member 14, the base member can include a slot 72 for a screwdriver or similar tool.

To separate the trays 10, the engagement member 14 is merely twisted counterclockwise to disengage the ball members 66 from the sockets 70. The leg members 56 are then removed from the apertures 58.

It is to be noted that the engagement member 14 provides clamping of the center of the trays 10 which are designed for slight flexing of the base 22 of the trays 10 during installation of the engagement member 14. The flexing enables the engagement member 14 to move into position and prevents a top tray 10 from damaging a chip 12 in a bottom tray 10 of the stack. At the same time, flexing of the base portion 22 provides increased gripping of the outer frame portion 24 to increase the stability of the stack.

Preferably, a top tray 10 in the stack does not contain any chips 12 and merely serves as a cover to maintain and protect the chips 12 in a bottom tray 10 of a stack. If desired, however, chips 12 can be placed in a top tray 10 of a stack and secured thereto in another manner.

Details of the pick-and-place mechanism 16 will now be provided. The mechanism 16 is preferably designed for orthogonal movement and substantially includes a base 80, a movable arm 82 and an integrated circuit chip alignment and gripping head assembly 84 having a head portion 84a.

Briefly, in operation, the head assembly 84 develops a slight suction which holds a chip 12 for removal from a bulk storage container or tray 18 and placement within a pocket 20 of a tray 10. The mechanism 16 is substantially manually activated and precisely positions the chips 12 without damage to the chips 12 or the leads 12b.

The base 80 includes a first portion 86 for placement of one or more trays 10 and a second portion 88 for placement of chips 12 carried by the bulk carrier container or tray 18. The first portion 86 includes two engagement pins 90, for each tray 10 to be positioned, for insertion with the notches 32a and 32b of the tray 10.

Thus, the pins 90 precisely position the trays 10 on the base 80 so that the trays 10 cannot readily move thereon. It is to be noted that the pins 90 and/or notches 32 can be replaced with any other elements so long as the desired precise positioning with respect to a centerline of the tray 10 is provided.

To ensure accurate positioning of a chip 12 within a desired pocket 20 of a tray 10, the mechanism 16 includes a positioning system including a locator arm 92 in operable connection with the head assembly 84 and a corresponding location plate 94 on the base 80. The locator arm 92 includes two locator pins 96 for insertion within desired corresponding apertures 98 provided within the location plate 94.

When the pins 96 are aligned with two apertures 98, the head 84a of the head assembly 84 is precisely positioned for placement of a chip 12 within a desired pocket 20 of a tray 10. As FIG. 9 illustrates, to ensure alignment and prevent binding of the pins 96 within the apertures 98, one pin 96a has a ball tip 100 with a relieved shaft 102 above the ball 100 while the other pin 96b is formed as a flattened spear tip 104 with a full size shaft 106 above the spear tip 104.

The movable arm member 82 includes first and second portions 108 and 110 having a belt system therein for providing the orthogonal movement as is known in the art. The first portion 108 is connected to the base 80 through a support 112 and a vacuum line 114 runs through the first and second portions 108 and 110 for attachment to the head assembly 84.

A pick-up assembly 116 is connected to a distal end 118 of the second portion 110 to which the head assembly 84 and the locator arm 92 are secured. Additionally, to assist an operator in positioning the arm 82, a finger wheel 120 is positioned atop the pick-up assembly 116.

The finger wheel 120 preferably includes a button 122 for activation of the vacuum line 114 with respect to the head 84a. To assist in pressing the button 122 and moving the head 84a, the button 122 preferably includes a groove 124 formed therein.

The pick-up assembly 116 includes a first spring (not illustrated) mounted therein for assisting in raising and lowering the entire arm 82 for pick up of the chip 12 and movement thereof. Additionally, to assist an operator in "feeling" the location of the chip 12 and preventing damage to the leads 12b of the chip 12, a light spring (not illustrated) is positioned within the head assembly 84.

As FIG. 10 illustrates, the head 84a includes a stem 126 and a chip engagement portion 128. The stem 126 includes a groove 130 positioned about its periphery for snapping engagement of the stem 126 in to the pick-up assembly 116. To locate the stem 126 with respect to the pick-up assembly 116, the groove 130 includes a detent 132 for seating of a corresponding member (not illustrated) within the pick-up assembly 116.

The chip engagement portion 128 conforms to the shape of the chip 12 and, in this embodiment, is a substantially square or rectangular planar member including depending side walls 134 positioned about its periphery. To assist in locating the head 84a with respect to a chip 12, the walls 134 are tapered outward. Additionally, to enable release of the chip 12 upon vacuum cut off from an aperture 138 and ensure that the vacuum will not hold unless the chip 12 is properly positioned, the side walls 134 include a passage 136 proximate each corner.

In operation, one or more empty trays 10 are positioned on the first portion 86 of the base 80 and a bulk matrix tray 18 with a potentially large number of chips 12 is positioned on the second portion 88 of the base 80. An operator grips the finger wheel 120 and moves the arm 82 to position the head 84a above a chip 12 positioned in the bulk matrix tray 18. The head 84 is lowered and the chip 12 is positioned within the confines of the side walls 134 for engagement with the vacuum from the aperture 138.

When the chip 12 is properly positioned within the head 84a, the vacuum takes hold and the chip 12 can be lifted out of the bulk matrix tray 18 upon lifting of the finger wheel 120 and arm 82 such as in the direction of arrow "A", for example. The arm 82, head assembly 84 and head 84a are then moved in the direction of arrow "B", for example, to a position above a pocket 20 of a tray 10.

Upon lowering of the head 84a, the pins 96 of the locator arm 92 align with apertures 98 of the locator plate 94 which correspond to the position of the selected pocket 20. Once the chip 12 is positioned within the pocket 20, the button 122 of the finger wheel 120 is depressed to shut off the vacuum and release the chip 12 from the head 84a. The process can be repeated until the desired number of chips 12 is mounted within a tray 10.

To prevent chips from falling off the tray 10 and protect the chips 12, the tray 10 positioned on the mechanism 16 can be secured to another tray 10 by the twist-lock engagement member 14 as described above. The trays 10 can then be stored or shipped as desired.

Modifications and variations of the present invention are possible in light of the above teachings. It is to be understood that within the scope of the claims the invention may be practiced other than specifically described.

We claim:

1. A tray for integrated circuit components, comprising:
   a base portion having an outer periphery;
   a plurality of pockets positioned in a predetermined pattern about said base portion, wherein each pocket is capable of housing an integrated circuit component therein; and
   fastening means for connecting a region of said base portion of said tray, which is disposed internally within said outer periphery of said base portion of said tray, to a cover such that said region of said base portion of said tray is flexibly moved into secure engagement with said cover so that said cover can protect said integrated circuit components and maintain said integrated circuit components within said pockets of said tray.

2. The tray as defined in claim 1 wherein said fastening means provide for ready releasable and repeatable connection of said base portion of said tray to at least one other tray base portion which serves as said cover to maintain and protect the components within said pockets.

3. The tray as defined in claim 1 wherein said base portion is positioned substantially in a central portion of said tray and said base portion flexes during fastening with respect to outer edges of said tray to provide gripping of said outer edges for increased stability.

4. The tray as set forth in claim 1, further comprising:

alignment means defined within a peripheral portion of said tray for facilitating accurate positioning of a centerline portion of said tray with respect to apparatus for depositing said integrated circuit components within said plurality of pockets.

5. The tray as defined in claim 1 wherein said base portion includes at least one aperture extending therethrough and said fastening means include an engagement member having at least one leg member for insertion through said aperture and for twist-lock engagement of said tray with said cover.

6. The tray as set forth in claim 5, wherein:

said at least one aperture extending through said base portion comprises a plurality of apertures disposed in a predetermined array within said base portion of said tray; and said at least one leg member comprises a plurality of leg members for respective insertion through said plurality of apertures extending through said base portion of said tray.

7. The tray as set forth in claim 6, further comprising:

a plurality of recessed sockets defined within undersurface portions of said base portion of said tray so as to be respectively disposed adjacent to said plurality of apertures extending through said base portion of said tray; and a plurality of ball members integrally provided upon distal end portions of said plurality of leg members for respective insertion within said plurality of recessed sockets of said base portion of said tray when said fastening means is twisted with respect to said base portion of said tray so as to achieve said twist-lock engagement of said tray with said cover.

8. The tray as set forth in claim 7, wherein:

said base portion of said tray is disposed at a substantially central portion of said tray and has a substantially square configuration; and said plurality of apertures extending through said base portion of said tray, and said plurality of recessed sockets defined within said undersurface portions of said base portion of said tray, comprises four apertures and four recessed sockets with a pair of apertures and a pair of recessed sockets disposed upon opposite sides of said substantially square base portion of said tray.

9. The tray as set forth in claim 5, further comprising:

slot means defined within said fastening means for accommodating a blade portion of a tool for imparting a twisting motion to said fastening means so as to achieve said twist-lock engagement of said tray with said cover.

10. A tray for integrated circuit components, comprising:

a base portion disposed within a substantially central portion of said tray and having an outer periphery;

a plurality of pockets, disposed in a predetermined pattern around and externally of said outer periphery of said base portion, for respectively housing integrated circuit components; and fastening means for connecting said base portion of said tray to a cover for releasable engagement therewith such that said cover protects said integrated circuit components and maintains said integrated circuit components within said pockets of said tray.

11. The tray as defined in claim 10, further comprising:

alignment means defined within a peripheral portion of said tray for facilitating accurate positioning of a centerline portion of said tray with respect to apparatus which places said integrated circuit components within said pockets.

12. The tray as set forth in claim 10, wherein:

said cover comprises another tray whereby a plurality of trays are able to be nestably stacked with respect to each other.

13. The tray as set forth in claim 10, further comprising:

a plurality of apertures defined within said base portion of said tray; and a plurality of leg members integrally disposed upon said fastening means and depending therefrom for insertion within said plurality of apertures defined within said base portion of said tray so as to secure said cover to said base portion of said tray by means of a bayonet-type twist-lock manipulation operation of said fastening means with respect to said base portion of said tray.

14. The tray as set forth in claim 13, further comprising:

a plurality of recessed sockets defined within undersurface portions of said base portion of said tray so as to be respectively disposed adjacent to said plurality of apertures defined within said base portion of said tray; and a plurality of ball members integrally provided upon distal end portions of said plurality of leg members for respective insertion within said plurality of recessed sockets of said base portion of said tray when said fastening means is twisted with respect to said base portion of said tray so as to achieve said bayonet-type twist-lock operation whereby said cover is secured to said base portion of said tray.

15. The tray as set forth in claim 13, further comprising:

slot means defined within said fastening means for accommodating a blade portion of a tool for imparting a twisting motion to said fastening means so as to achieve said bayonet-type twist-lock manipulation operation of said fastening means with respect to said base portion of said tray.

16. A tray for integrated circuit components, comprising:

a base portion having an outer periphery;

a plurality of pocket means, disposed in a predetermined pattern throughout said base portion, for respectively housing integrated circuit components; and fastening means for connecting a region of said base portion of said tray, which is disposed internally within said outer periphery of said base portion of said tray, to a cover for releasable engagement therewith such that said cover protects said integrated circuit components and maintains said integrated circuit components within said pockets of said base portion of said tray.

17. The tray as set forth in claim 16, wherein:

said cover comprises another tray whereby a plurality of trays are able to be nestably stacked with respect to each other.

18. The tray as set forth in claim 16, further comprising:

a plurality of apertures defined within said base portion of said tray; and a plurality of leg means, integral with said fastening means and depending therefrom, for insertion within said plurality of apertures defined within said base portion of said tray so as to secure said cover to said base portion of said tray by means of a bayonet-type twist-lock manipulative operation of said fastening means with respect to said base portion of said tray.

19. The tray as set forth in claim 18, further comprising:

a plurality of recessed sockets defined within undersurface portions of said base portion of said tray so as to be respectively disposed adjacent to said plurality of apertures defined within said base portion of said tray; and a plurality of ball members integrally provided upon distal end portions of said plurality of leg members for respective insertion within said plurality of recessed sockets of said base portion of said tray when said fastening means is twisted with respect to said base portion of said tray so as to achieve said bayonet-type twist lock manipulative operation whereby said cover is secured to said base portion of said tray.

20. The tray as set forth in claim 18, further comprising:

slot means defined within said fastening means for accommodating a blade portion of a tool for imparting a twisting motion to said fastening means so as to achieve said bayonet-type twist-lock manipulative operation of said fastening means with respect to said base portion of said tray.

* * * * *